United States Patent [19]
Nondahl et al.

[11] Patent Number: 5,347,277
[45] Date of Patent: Sep. 13, 1994

[54] DUAL PHASE RESOLVER TO DIGITAL CONVERTER

[75] Inventors: Thomas A. Nondahl, Wauwatosa; Robert L. Pitsch, Grafton; David M. Brod, Greendale, all of Wis.

[73] Assignee: Allen-Bradley Company, Inc., Milwaukee, Wis.

[21] Appl. No.: 954,837

[22] Filed: Sep. 30, 1992

[51] Int. Cl.$^5$ .............................................. H03M 1/64
[52] U.S. Cl. .................................. 341/116; 341/112; 341/115
[58] Field of Search ............... 341/111, 112, 116, 117, 341/118, 115

[56]  References Cited
U.S. PATENT DOCUMENTS

| | | | |
|---|---|---|---|
| 3,918,044 | 11/1975 | Alpatoff et al. | 341/115 X |
| 4,204,257 | 5/1980 | Hungerford | 341/117 |
| 4,472,669 | 9/1984 | Denham et al. | 341/115 X |
| 4,831,510 | 5/1989 | Dummermuth et al. | 341/116 X |
| 4,933,674 | 6/1990 | Gasperi et al. | 341/116 |

Primary Examiner—Sharon D. Logan
Attorney, Agent, or Firm—John J. Horn; H. Frederick Hamann

[57] ABSTRACT

A dual phase resolver to digital converter having two separate channels for generating rotor position data. The first channel generates an indication of rotor position based on a sinewave type reference signal applied to a first stator winding and the rotor signal while the second channel provides an indication of rotor position based on a cosinewave type reference signal applied to the second stator winding and the rotor signal. Logic circuitry associated with the data channels provide separate fault data indicative of when position data may be subject to error. The data from the two channels are selectively combined in the output of the converter. Data from one channel is used when the other channel is subject to fault. An average of the data is used when both channels are operating properly in order to provide greater accuracy.

10 Claims, 4 Drawing Sheets

DUAL PHASE RESOLVER TO DIGITAL CONVERTER

BACKGROUND OF THE INVENTION

The present invention relates to systems for measuring rotor shaft position for motor control purposes and the like and more particularly relates to phase analog resolver to digital converters which provide an indication of rotor position using a high speed digital counter to measure the phase shift between stator and rotor signals.

Resolvers ordinarily comprise rotating transformers which are constructed and arranged to produce different voltages as they turn. Resolvers consist of two components, a stator which is stationary and a rotor which is fixed to a rotating shaft having an angular position to be measured. Resolvers also have three electrical windings two of which are located on the stator (and are ordinarily offset by 90° electrical from one another) and one of which is installed on the rotor. As the shaft turns and the rotor rotates with a respect to the stator, the rotor winding changes alignment with the stator windings so that the rotor winding is in phase with different stator windings at different points during its rotation.

When the stator windings are excited with sinewave and cosinewave type reference signals a voltage is induced in the rotor winding as the rotor rotates which is a function of the reference signals applied to the stator windings and the rotor position. As a consequence the rotor position can be determined by measuring the phase shift or lag of the rotor voltage with respect to one of the reference voltages (either the sinewave type signal or cosinewave type signal) supplied to the electrical windings on the stator.

Phase analog resolver to digital converters are commonly used to measure the phase shift or lag between the stator reference and rotor signals. Phase analog detectors use high speed digital counters to measure the phase lag between the stator and rotor voltages with the counter being enabled to count the pulses in a high speed clock signal when the voltage applied to the stator winding crosses zero with a positive slope and being stopped when the rotor winding voltage crosses zero with a positive slope. The resulting counter value is stored in a latch for transfer to a microprocessor system as the counter is reset to prepare for the next cycle.

Unfortunately, while phase analog resolver to digital converters provide a simple method of generating a digital representation of mechanical shaft position, there are important weaknesses in the phase analog detection technique. When the zero crossing points for the reference and rotor signals occur at almost the same time (i.e. in "near coincidence") the counter can give incorrect position indications since the circuitry may not have sufficient time to clear previous data data from the system components. Additionally, the circuitry can skip rotor position samples or readings when the zero crossing point of the rotor signal changes from just after the zero crossing point of the stator reference signal to just before the zero crossing point of the stator reference signal (i.e. two rotor zero crossing points occur before a stator reference signal zero crossing point) as it automatically does once for every revolution of the rotor. Erroneous position readings resulting from near coincidence of the zero crossing points and skipped rotor position readings are serious problems that frequently cause major difficulties for controllers which use the feedback information provided by phase analog resolver to digital converters.

It is therefore an object of the present invention to provide a phase analog type resolver to digital converter which produces rotor position measurements which are not subject to error due to near coincidence between the zero crossing points of the stator reference and the rotor signals or skipped rotor position readings.

It is a further object of the present invention to provide a phase analog type resolver to digital converter which produces a more accurate measurement of rotor position at the same time that it avoids problems due to skipped rotor position readings and incorrect position indications due to failure of its circuitry to clear previous data.

It is yet another object of the present invention to provide a resolver to digital converter which functions to provide rotor position information more reliably and accurately at all times and under all conditions for use by motor controllers and the like.

SUMMARY OF THE INVENTION

The present invention constitutes a dual phase resolver to digital converter having two channels by which phase lag information is generated using stator reference and rotor signals from a rotor position resolver. The resolver includes a stator provided with two electrical windings which are generally separated by 90° (electrical) and which are excited by separate sinewave and cosinewave type reference signals and includes a rotor provided with a winding which generates a rotor signal as the rotor rotates. A sinewave type signal applied to the first stator winding and the rotor signal are used as inputs to a first rotor position data channel (A) while the cosinewave type signal applied to the second stator winding and the rotor signal are used as inputs to a second rotor position data channel (B). Each of the data channels (A and B) include separate steering logic modules, counters and latches for generating and processing phase lag data. The first channel (A) produces data representing the phase lag between the sinewave type signal and the rotor signal which provides a measurement of rotor position. The second channel (B) produces data representing the phase lag between the cosinewave type reference signal and the rotor signal which also provides a measurement of rotor position. The steering logic associated with the data channels include circuitry for generating data fault signals indicative of when the position data produced by the channel with which the steering logic is associated is subject to error. The position data and fault data are provided to a microprocessor system which selects the channel A data as the output of the converter when the channel B data is subject to fault and selects the channel B data as the output of the converter when the channel A data is subject to fault. When neither the channel A or channel B data are subject to fault, the microprocessor system uses both (averages) the channel A and channel B rotor position data to provide a more reliable and accurate indication of rotor position as the output of the converter.

In the preferred embodiment, the steering logic modules for the channels (A and B) include sets of flip-flops for detecting the positive going zero crossing points of processed versions (squared off) of the sinewave and cosinewave type reference signal and the rotor signal. The relative timing of the zero crossing points of the sinewave type signal and the rotor signal is used in defining the phase lag between these signals and in starting and stopping the channel A counter whereby a measure of phase lag and corresponding rotor position is produced on channel A. The relative timing of he zero crossing points between the cosinewave type signal and the rotor signal is used in defining the phase lag between these signals and in starting and stopping the channel B counter whereby another measure of the phase lag and corresponding rotor position is produced on channel B. The flip-flops included in the steering logic modules are also responsive to the timing of the zero crossings of the reference signals with respect to the rotor signal for generating data fault signals whenever the zero crossing points of the reference signal or the rotor signal are in near coincidence or a rotor position reading is skipped and the rotor position data is subject to error.

DESCRIPTION OF THE PREFERRED EMBODIMENT

Figure 1:
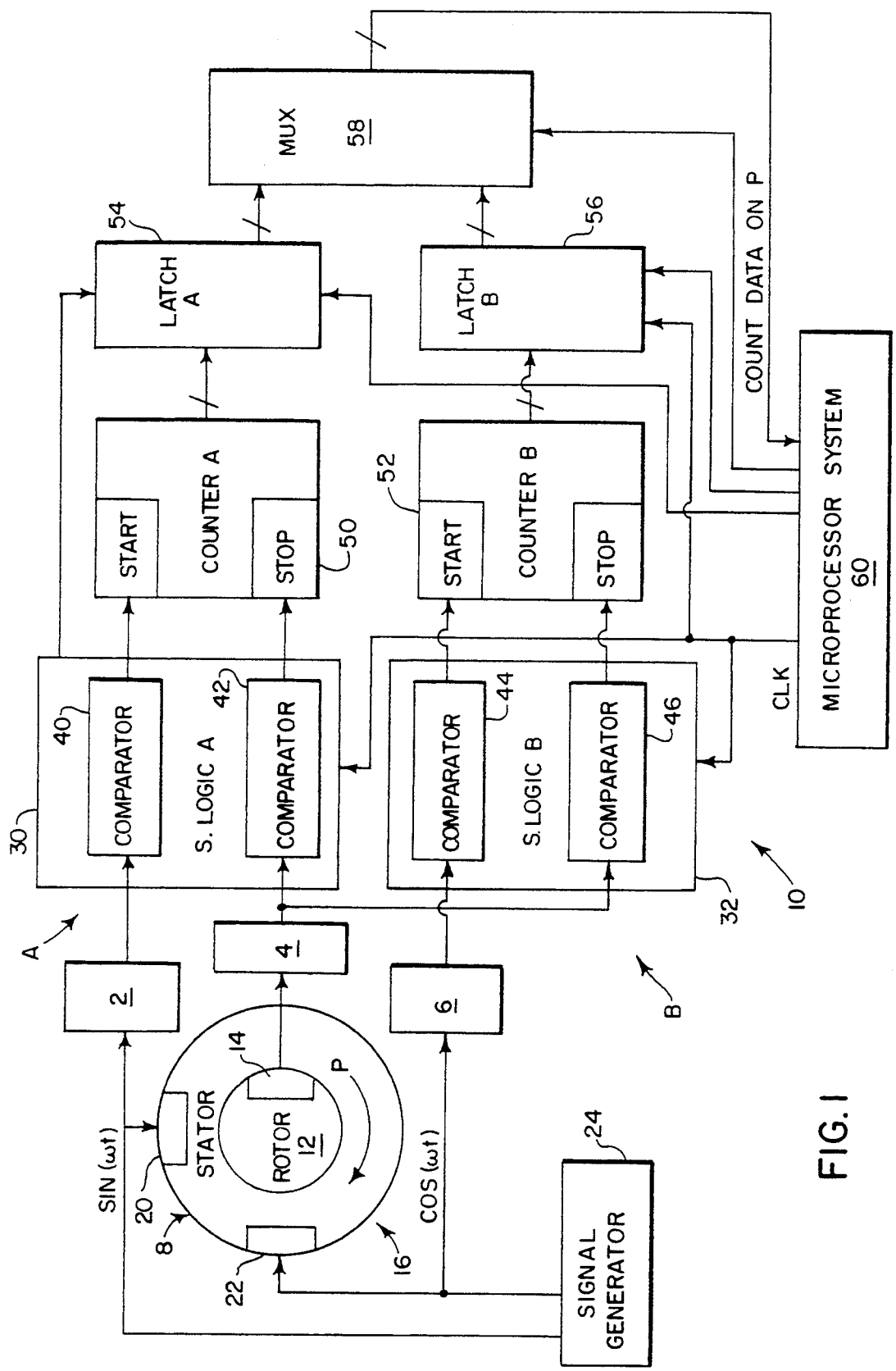
FIG. 1 provides an overall block diagram of the dual phase resolver to digital converter of the present invention with reference to the resolver from which it receives its input signals.

Referring now to FIG. 1, a dual phase analog resolver to digital converter 10 is shown for measuring motor shaft position in order to provide feedback to a motor controller. The resolver 8 from which the converter 10 receives its inputs includes a rotor 12 having an electrical winding 14 and a stator 16 having electrical windings 20 and 22 which are oriented at 90° to one another. A sinewave type reference signal is produced by the signal generator 24 and is used to excite the stator winding 20. A cosinewave type reference signal is also produced by the signal generator 24 and used to excite the stator winding 22. The signal generator 24 may be as simple as an EPROM providing varying voltage levels in response to the output of a counter driven by a clock signal (with the varying voltage level signal being as elementary as a square wave). Since the rotor winding 14 is alternately in-phase and out-of-phase with the stator windings 20 and 22, the voltage induced in the rotor winding 14 during the rotation of the rotor 12 is given by equation (1) below:

$$V_R = A \times \cos(wt-P) \quad (1)$$

where:
$V_R$ = rotor voltage
w = angular frequency
A = peak amplitude of rotor voltage
cos(wt) = voltage applied to stator winding
O = angular position of rotor The rotor position can therefore be determined by measuring the phase shift or "lag" of the rotor voltage signal with respect to either one of the voltage signals applied to the electrical windings 20 and 22.

The sinewave type reference signal applied to the winding 20 is also directed to the steering logic module 30 through the processing unit 2 while the cosinewave type reference signal applied to the stator winding 22 is also directed to the steering logic module 32 through the processing unit 4. The rotor signal generated by the rotor winding 14 is supplied to both the steering logic modules 30 and 32 through the processing unit 6. The processing units 2, 4 and 6 "square off" the reference signals and rotor signal using comparators and filter these signals to suppress high frequency noise. Both of the modules 30 and 32 contain similar configurations of logic circuitry for detecting the positive-slope zero crossing points of the reference signals and the rotor signal. These functions may be thought of as simple comparison operations as indicated by the comparators 40, 42, 44 and 46 for defining timing intervals associated with the phase differences between the reference signals and the rotor signal.

The signals produced by the comparators 40 and 42 are used to stop and start the counter 50 while the signals generated by the comparators 44 and 46 are used to start and stop the counter 52. Since the comparator 40 identifies the zero crossing point of the sinewave type signal while the comparator 42 identifies the zero crossing point of the rotor signal a phase lag is delimited during which the counter 50 counts clock pulses in proportion to this phase lag. Since the comparator 44 identifies the zero crossing point of the cosinewave type signal while the comparator 46 identifies the zero crossing point of the rotor signal, a phase lag interval is delimited during which the counter 52 counts clock pulses in proportion to this phase lag. The output data from the counters 50 and 52 are passed to the latches 54 and 56, respectively, from where they are directed through the multiplexer 58 to the microprocessor system 60.

The steering logic module 30, counter 50 and latch 54 define a first channel A for detecting rotor position information while the steering logic module 32, counter 52 and latch 56 define a second channel B for detecting rotor position information. In response to commands from the microprocessor system 60 the multiplexer 58 directs information either from the first channel A or the second channel B to the microprocessor for processing to determine rotor position. The present invention comprises a dual phase resolver to digital converter 10 having two channels which allows the microprocessor system to select from information provided by either of these channels whereby the accuracy of the system can be greatly improved because weaknesses in prior art phase analog detection techniques can be overcome.

Figure 2:
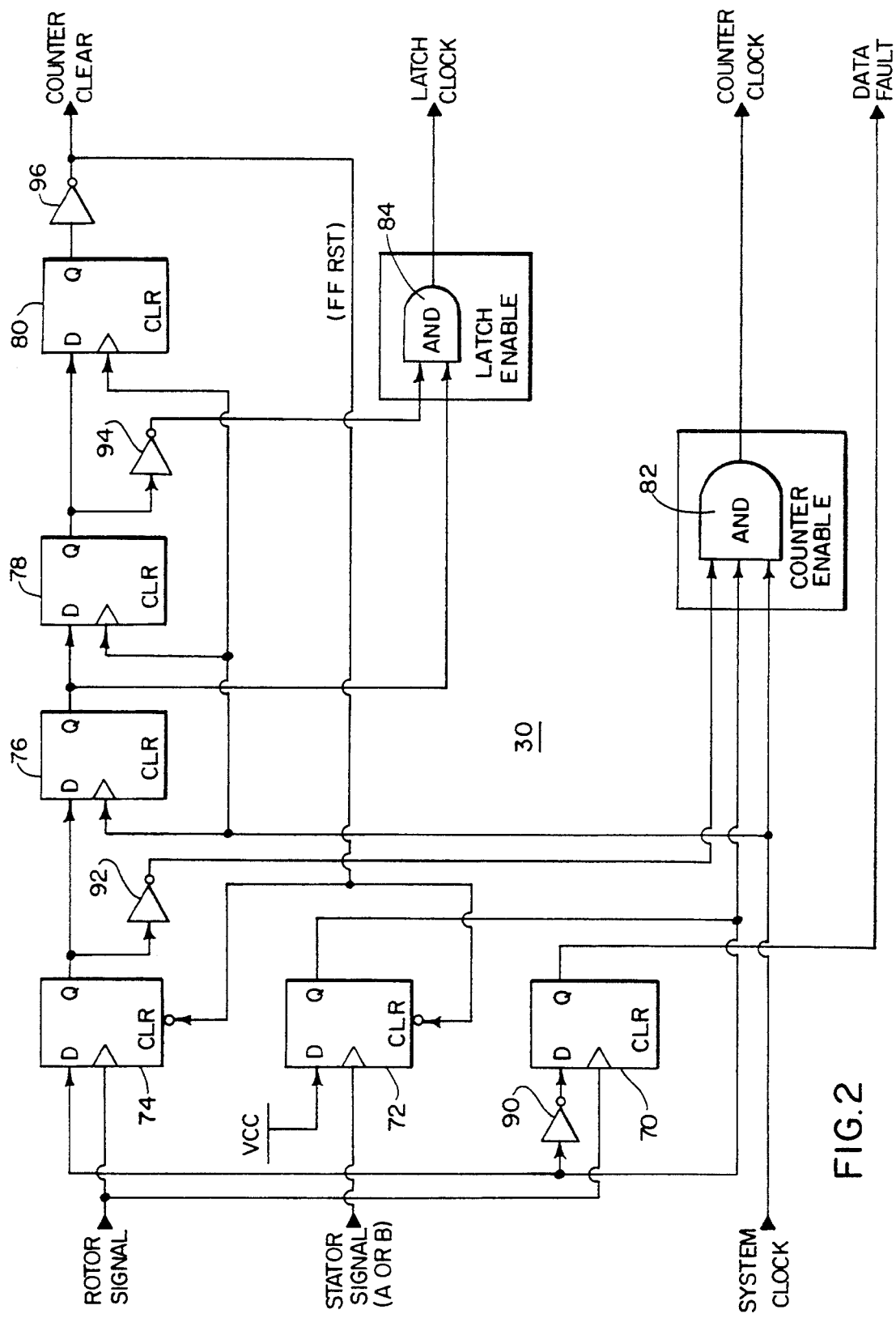
FIG. 2 provides a schematic diagram of one of the steering logic modules shown in FIG. 1 whereby the operation of the present invention can be understood in greater detail.

Referring now to FIG. 2, the steering logic module 30 is shown in greater detail as including several digital logic units adapted for receiving the rotor signal and one or the other of the stator reference signals (i.e. sinewave type signal) in addition to a clock signal and providing a counter clock signal, a counter clear signal, a latch clock signal and a data fault signal. The steering logic module 30 includes three D flip-flops 70, 72 and 74 with flip-flop 72 being clocked by the stator reference signal (processed version) and the flip-flops 70 and 74 being clocked by the rotor signal (processed version). The flip-flops 72 and 74 are operative in enabling the counter 50 to count clock pulses over the phase lag interval between the stator reference signal and the rotor signal. The flip-flop 70 is operative in indicating when the zero crossing points of the rotor and stator signal are in near coincidence or a rotor position reading is skipped and the steering logic or counter are therefore subject to error in providing rotor position information. The steering logic 30 also includes three D flip-flops 76, 78 and 80 which are connected in series with the flip-flop 74. The flip-flops 76 and 78 are operative in enabling the latch 54 while the flip-flop 80 is operative in clearing the counter 50 and resetting the flip-flops 72 and 74. The steering logic module 30 also includes the AND gates 82 and 84 which are operative in generating the counter clock and latch clock signals. The AND gate 82 operates in response to signals from the flip-flops 74 (by way of inverter 92) and 72 and the system clock signal. The AND gate 84 operates in response to signals from the flip-flops 76 and 78 (by way of inverter 94).

During normal operations when the zero crossing points of the stator reference and rotor signals are not in near coincidence and a rotor position reading has not been skipped, the flip-flop 72 toggles to a logic one signal on its Q output when it is clocked by the stator reference signal going high through a zero crossing point. The logic one signal on the Q output of the the flip-flop 72 is supplied to the AND gate 82, the inverter 92 and the D input of the flip-flop 74. Since the inverter 92 has a logic one output under normal conditions, the AND gate 82 is then continuously toggled by the system clock signal to provide a clock signal for the counter 50 on its output in response to the logic one output of the flip-flop 72. Therefore, the counter 50 begins counting clock pulses when the Q output of the flip-flop 72 assumes the logic one state in response to the stator reference signal going high through a zero crossing point.

The flip-flop 74 in turn toggles to provide a logic one signal on its Q output in response to the rotor signal going high through a zero crossing point. As the Q output of the flip-flop 74 assumes a logic one state, the output of the inverter 92 shifts to a logic zero state and the AND gate 82 is disabled from toggling in response to the system clock signal and therefore provides a logic zero output on a continuous basis. As the logic one output of the flip-flop 74 is sequentially passed to the flip-flops 76, 78 and 80 the Q outputs of these flip-flops sequentially assume a logic one state. Since the inverter 94 normally provides a logic one output when the Q output of the flip-flop 76 toggles to a logic one state, the AND gate 84 provides a logic one signal on its output whereby the latch 54 is enabled (clocked) for receiving data. When the flip-flop 78 subsequently toggles its Q output to the logic one state, the output of the inverter 94 shifts to the logic zero state and the AND gate 84 shifts back to a logic zero output thereby completing the operation by which data is supplied from the counter 50 to the latch 54. When the Q output of the flip-flop 80 toggles to the logic one state the output of the inverter 96 assumes the logic one state and provides the counter clear signal which also serves to reset the flip-flops 72 and 74.

In cases where the rotor signal goes high through a zero crossing point just ahead of the stator reference signal after going through a zero crossing point just behind the stator reference signal (two rotor signal zero crossing points are experienced before a stator reference signal zero crossing point is experienced and a rotor position reading is skipped) and the steering logic module 30 is subject to large errors in determining rotor position, the logic zero signal provided on the Q output of the flip-flop 72 is inverted by the inverter 90 and provided to the D input of the flip-flop 70. As the rotor signal goes through its zero crossing point the flip-flop 70 toggles its Q output to the logic one state in response to its clock input going high. The logic one signal on the Q output of flip-flop 70 is provided as a data fault signal along with the counter data. This data fault signal is then used by the microprocessor system 60 as an indication of a skipped rotor position reading and fault conditions at the module 30.

Additionally, when the stator reference signal goes through a zero crossing point very shortly after the rotor signal goes through a zero crossing point and before the steering logic module 30 has had an opportunity to complete its full cycle of operation, erroneous rotor position indications may result. The flip-flop 72 will continue providing a logic one output as the stator reference signal goes through its zero crossing point. However, the reset signal (counter clear signal) from the inverter 96 very shortly toggles the Q output of the flip-flop 72 to the zero logic state in response to which the output of the inverter 90 assumes the logic one state. As the rotor signal goes high through its next zero crossing point and accordingly clocks the flip-flop 70 its Q output assumes a logic one state which provides an indication of a fault condition due to near coincidence of signal crossing points to the microprocessor system 60.

Figure 3:
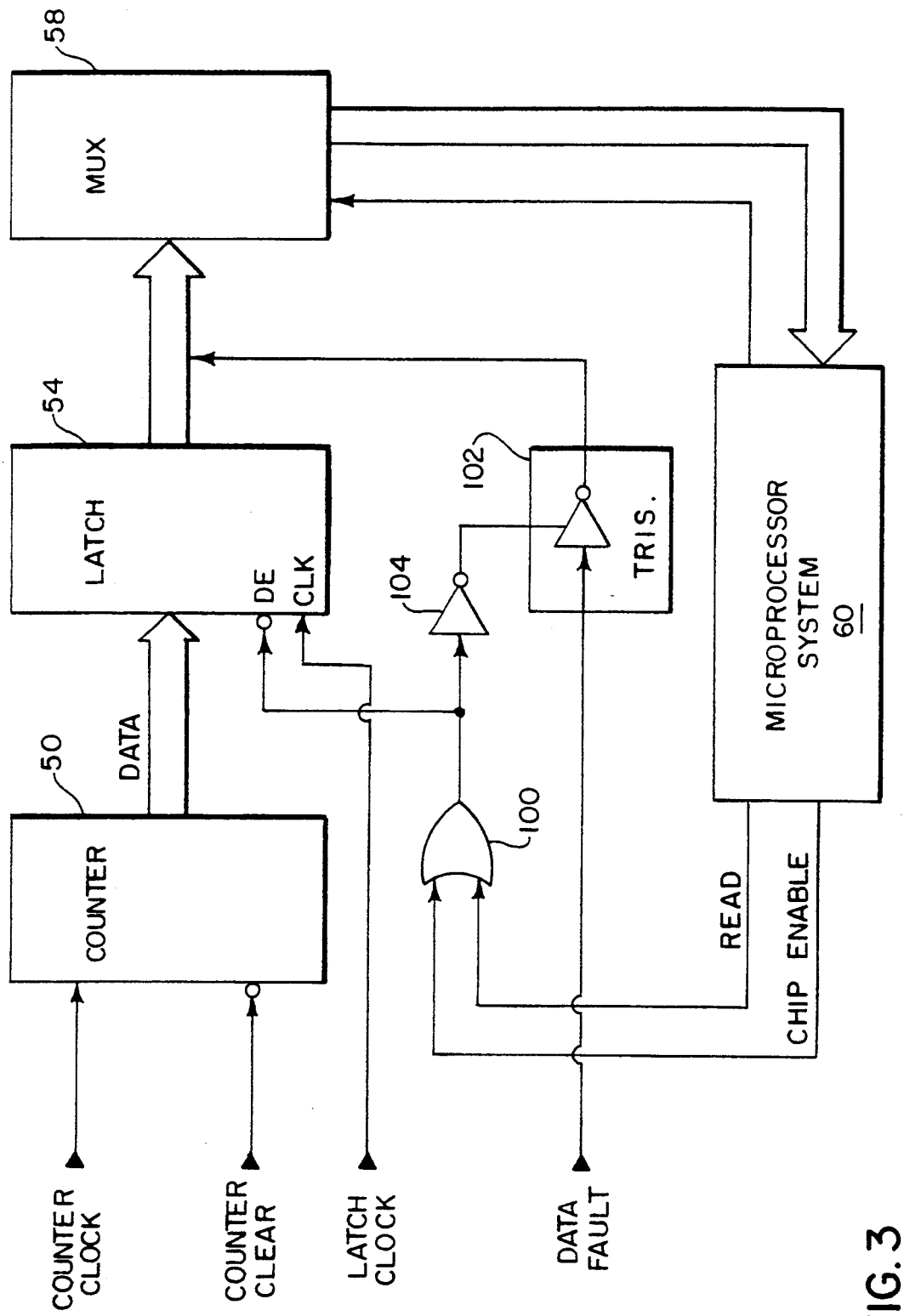
FIG. 3 provides a schematic and block diagram illustrating the interconnections between the counter, latch and multiplexer for one channel of the converter of the present invention and in particular illustrating the data flow path from one of the counters to microprocessor system.

Referring now to FIG. 3, the counter clock signal from the AND gate 82 and the counter clear signal from the inverter 96 are supplied to the counter 50 for regulating its operation in counting pulses during the phase lag interval. The resulting count data is supplied on parallel lines to the latch 54. The operation of the latch 54 is controlled in accordance with the latch clock signal from the AND gate 84 and chip enable and read signals from the microprocessor system 60 which are provided to by way of the OR gate 100 in order to ensure concurrency and provide an overall output enable signal for proper operation of the latch 54. The output enable signal from the OR gate 100 is also provided to a tri-state switch 102 through an inverter 104 whereby the supply of the data fault signal to the microprocessor is simultaneously controlled along with the supply of the count data by way of the latch 54.

Figure 4:
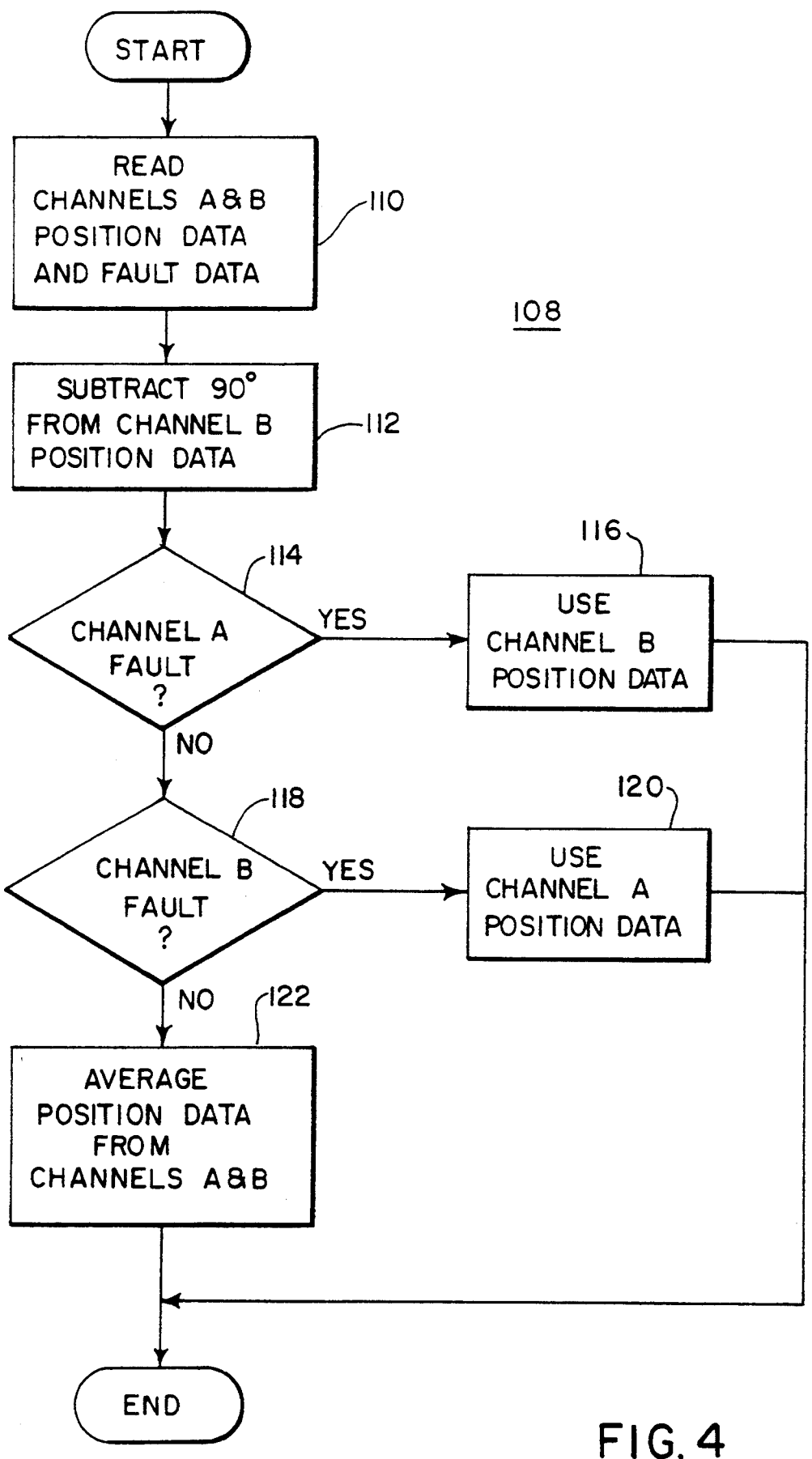
FIG. 4 provides a flow chart for the program executed by the microprocessor system of the present invention in response to the rotor position data and fault data provided to the microprocessor system from the steering logic modules and counters of the converter of the present invention.

Referring now to FIG. 4, the program 108 includes seven steps for generating accurate rotor position data in response to rotor position and data fault inputs from the two channels A and B of the converter 10. In step 110 data is read through the multiplexer 58 from the latches 54 and 56 representing the phase lag from channel A between the sinewave type reference signal applied to the stator winding 20 and the rotor signal and the phase lag from channel B between the cosinewave type signal applied to the stator winding 22 and the rotor signal. The program 108 then proceeds to step 112 in which phase difference value of 90° electrical is subtracted from the channel B rotor position data to correct the channel B position data to be (theoretically) in phase with the channel A position data. In step 114 the fault data from channel A is queried to ascertain whether a fault is indicated with a respect to the channel A rotor position data. If a fault is indicated in the channel A rotor position data, the program 108 proceeds to step 116 by which it outputs the channel B rotor position value as the rotor position output of the converter 10. In step 118 the fault data from channel B is queried to ascertain whether a fault is indicated with respect the channel B rotor position data. If a fault is indicated in the channel B rotor position data, the program 108 proceeds to step 120 by which it outputs the channel A rotor position value as the rotor position output of the converter 10. If a fault is not indicated with a respect to the channel B position data the program is directed to step 122 in which the rotor position data from channels A and B is averaged together in order to provide a more accurate rotor position value as the final output of the converter 10.

We claim:

1. A rotor shaft position detection system, comprising:
   a rotor having a rotor winding for producing a rotor signal;
   a stator having a first stator winding and a second stator winding;
   means for exciting said first stator winding with a sinewave type reference signal and for exciting said second stator winding with a cosinewave type reference signal;
   means for measuring a first phase lag of the rotor signal with respect to the sinewave type reference signal;
   means for measuring a second phase lag of the rotor signal with respect to the cosinewave type reference signal; and
   output means for providing an indication of said rotor shaft position, wherein said indication is based upon said first phase lag when said rotor signal and said cosinewave type reference signal are in near coincidence or a rotor position reading has been skipped by said means for measuring a second phase lag, and said indication is based upon said second phase lag when said rotor signal and said sinewave type reference signal are in near coincidence or a rotor position reading has been skipped by said means for measuring a first phase lag.

2. The rotor shaft position detection system of claim 1, wherein said output means further includes means for averaging said first and second phase lags after displacing one of said first or second phase lags by an angular amount sufficient for both first and second phase lags to be in phase with each other in order to produce an averages phase lag and in which said indication of rotor shaft position is based upon said average phase lag when neither said sinewave type reference signal nor said cosinewave type reference signal is in near coincidence with said rotor signal and rotor position readings have not been skipped by either of said means fur measuring first and second phase lags.

3. The rotor shaft position detection system of claim 1, wherein:
   said means for measuring said first phase lag includes first comparator means for identifying first rising zero crossing points of said sinewave type reference signal,
   said means for measuring said second phase lag includes second comparator means for identifying second rising zero crossing points of said cosinewave type reference signal,
   third comparator means are included for identifying third rising zero crossing points of said rotor signals,
   said means for measuring said first phase lag further includes first counter means for counting clock pulses starting on said first zero crossing points and ending on said third zero crossing points, and
   said means for measuring said second phase lag further includes second counter means for counting clock pulses starting on said second zero crossing and ending on said third zero crossing points.

4. A method of detecting rotor shaft position using a resolver having a rotor with a rotor winding and a stator with first and second stator windings, said method comprising the steps of:
   a) exciting said first stator winding with a sinewave type signal and exciting said second stator winding with a cosinewave type signal;
   b) measuring a first phase shift between a rotor signal produced by the rotor winding and the sinewave type signal and detecting when said first phase shift is subject to error;
   c) measuring a second phase shift between the rotor signal and the cosinewave type signal and detecting when said second phase shift is subject to error; and
   d) providing an indication of said rotor shaft position which is based upon said first phase shift when the second phase shift is subject to error, and which is based upon when the first phase shift is subject to error.

5. The method of claim 4, wherein said step of providing an indication of said rotor shaft position based upon said first or said second phase shift further includes the substep of averaging said first and second phase shifts after displacing one of said first or second phase shifts by an angular amount sufficient for said first and second phase shifts to be in phase with each other in order to produce an averaged phase shift and wherein said indication of said rotor shaft position is based upon said averaged phase shift when neither said first phase shift nor said second phase shift are subject to error.

6. The method of claim 4, wherein:
   step (b) of measuring said first phase shift includes a substep of identifying rising zero crossing points of said sinewave signal,
   step (c) of measuring said second phase shift includes a substep of identifying second rising zero crossing points of said cosinewave signal,
   a step (e) is included to identify third rising zero crossing points of said rotor signal,
   step (b) of measuring said first phase shift further includes a substep of counting clock pulses starting on said first zero crossing points and ending on said third zero crossing points, and
   step (c) of measuring said second phase shift further includes a substep of counting clock pulses starting on said second zero crossing points and ending on said third zero crossing points.

7. In a rotor position detection system including a resolver having a rotor with a rotor winding and a stator with first and second stator windings and including means for exciting said first stator winding with a first reference signal and exciting said second stator winding with a second reference signal, the improvement comprising:
   means for measuring a first phase shift of a rotor signal produced by said rotor winding with respect to the first reference signal and detecting when said first phase shift may be subject to error;

means for measuring a second phase shift of the rotor signal with respect to the second reference signal and detecting when said second phase shift may be subject to error;

means for producing an averages phase shift by averaging said first and second phase shifts after displacing one of said first or second phase shifts by an angular amount sufficient for said first and second phase shifts to be in phase with each other; and means for providing a shaft position output from said detection system, the shaft position output being based upon said first phase shift when said second phase shift may be subject to error, the shaft position output being based upon said second phase shift when said first phase shift may be subject to error, and the shaft position output being based upon said averaged phase shift when neither said first phase shift nor said second phase shift may be subject to error.

8. The detection system of claim 7, wherein:

said means for measuring said first phase shift includes first comparator means for identifying first rising zero crossing points of said first reference signal, said means for measuring said second phase shift includes second comparator means for identifying second rising zero crossing points of said second reference signal, third comparator means are included for identifying third rising zero crossing points of said rotor signal, said means for measuring said first phase shift further includes first counter means for counting clock pulses starting on said first zero crossing points and ending on said third zero crossing points, and said means for measuring said second phase shift further includes second counter means for counting clock pulses starting on said second zero crossing points and ending on said third zero crossing points.

9. The detection system of claim 8, wherein each of said means for measuring and detecting includes a first flip-flop clocked by a processed version of one of said reference signals and a second flip-flop clocked by a processed version of said rotor signal for identifying zero crossing points.

10. The detection system of claim 8, wherein each of said means for measuring phase shift includes a steering logic module for identifying zero crossing points and detecting data error conditions, a counter for counting clock pulses over an interval defined by the crossing points of reference and rotor signals and a latch for storing phase shift data from said counter.

* * * * *